(12) United States Patent
Job Doraisamy et al.

(10) Patent No.: US 8,169,069 B2  
(45) Date of Patent: May 1, 2012

(54) INTEGRATED SEMICONDUCTOR OUTLINE PACKAGE

(75) Inventors: Stanley Job Doraisamy, Setapak (MY); Wae Chet Yong, Semabok (MY)

(73) Assignee: Infineon Technologies AG, Munich (DE)

( * ) Notice: Subject to any disclaimer, the term of this patent is extended or adjusted under 35 U.S.C. 154(b) by 253 days.

(21) Appl. No.: 12/513,906

(22) PCT Filed: Dec. 5, 2006

(86) PCT No.: PCT/SG2006/000379  
§ 371 (c)(1),  
(2), (4) Date: May 7, 2009

(87) PCT Pub. No.: WO2008/069755  
PCT Pub. Date: Jun. 12, 2008

(65) Prior Publication Data  
US 2010/0007006 A1    Jan. 14, 2010

(51) Int. Cl.  
*H01L 21/302*    (2006.01)
(52) U.S. Cl. .............. 257/691; 257/E23.079
(58) Field of Classification Search .......... 257/706, 257/712, 718, 719, 720, 691, 685, 686, E23.079, 257/E23.08, E23.113  
See application file for complete search history.

(56) References Cited

U.S. PATENT DOCUMENTS

| | | | |
|---|---|---|---|
| 3,522,490 A | 8/1970 | Kauffman | |
| 5,663,597 A | 9/1997 | Nelson et al. | |
| 5,671,125 A | 9/1997 | Russell et al. | |
| 5,887,342 A | 3/1999 | Maier et al. | |
| 6,396,133 B1 | 5/2002 | James | |
| 6,472,737 B1 * | 10/2002 | Corisis et al. .......... | 257/691 |

FOREIGN PATENT DOCUMENTS

| | | |
|---|---|---|
| DE | 33 22 734 A1 | 1/1985 |
| GB | 1 285 735 | 10/1969 |
| JP | 63-151057 | 6/1988 |
| JP | 2000-208686 A | 7/2000 |

* cited by examiner

*Primary Examiner* — Hoa B Trinh  
(74) *Attorney, Agent, or Firm* — Slater & Matsil, L.L.P.

(57) ABSTRACT

A transistor outline package is provided for a semiconductor integrated device suitable for use in a control module of an automobile for connection between a printed circuit board and a bus bar of such a module. The package includes a package housing, having a first end suitable for mounting to a PCB and which has a width. The package is also formed with a leadframe which includes a heat sink and ground plane blade suitable for connection to a bus bar, a plurality of connector leads suitable for connection to a PCB and at least one source tab lead suitable for connection to a module connector of such a control module. The plurality of connection leads and the source tab lead extend from the first end of the package housing side by side in the direction along and within the width of the first end of the package housing.

25 Claims, 7 Drawing Sheets

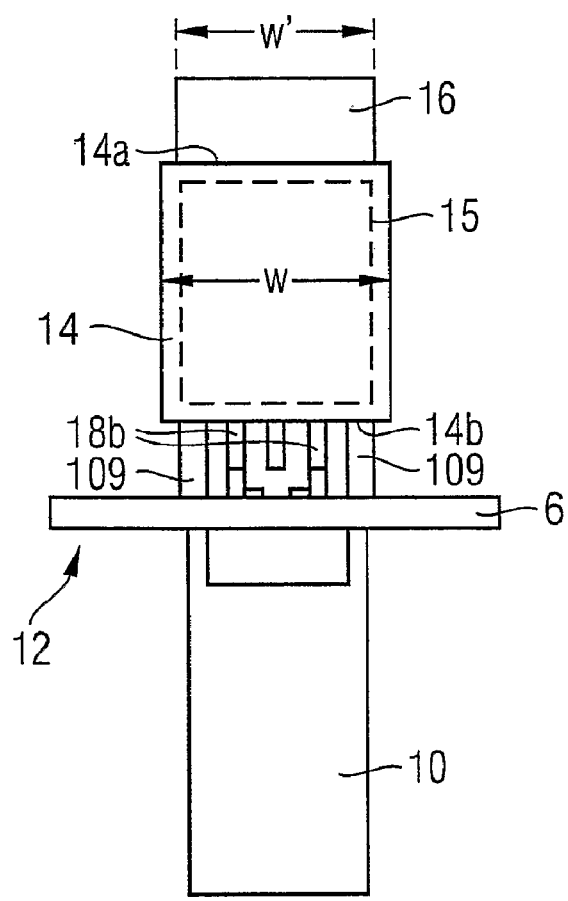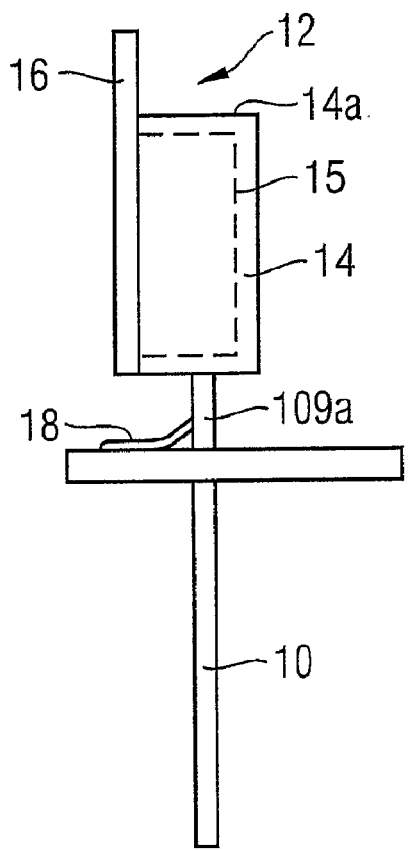

INTEGRATED SEMICONDUCTOR OUTLINE PACKAGE

BACKGROUND

This invention relates to an integrated semiconductor outline package and refers particularly, but not exclusively, to a transistor outline package for connection between a printed circuit board (PCB) and a bus bar of a control module of an automobile.

Electrical power distribution systems for automobiles, typically include a control module that provides centralized control of the electronic components of the automobile. A conventional control module includes a junction box, which is commonly referred to as a smart junction box. The junction box includes a housing that contains one or more layers of PCBs, which support semiconductor integrated devices. The control module also includes module connectors to provide electrical connections between the control module and the electronic components of the automobile.

Some of the devices mounted on the PCBs of the control module generate significant amounts of heat. Such devices are generally provided in transistor outline (TO) packages so as to provide heat dissipation and there is an increasing demand for TO packages which provide high levels of heat dissipation.

The United States Council for Automotive Research (US-CAR) maintains strict requirements for the mounting of TO packages on a PCB in such control modules, such as limitations on terminal (pin) thickness and width, as well as pin to pin pitch and pin row to pin row pitch, which place restrictions on the leadframe design of TO packages.

SUMMARY OF INVENTION

A semiconductor package is provided with a heat sink blade which extends from an end of the package so as to provide heat sinking from the package to an external heat sink. The package is also provided with a set of leads having portions which extend side-by-side from an opposite end of the package and within a width measurement of the package. At least one of the leads is a connection lead suitable for surface mounting on a printed circuit board and at least one of the leads is a source tab lead suitable for through mount connection to a module connector or transitions into such a module connector. The heat sink blade and the set of leads are formed from the package leadframe. To provide space for the connection leads within the width measurement, the source tab lead is formed with a neck portion.

BRIEF DESCRIPTION OF DRAWINGS

There shall now be described by way of some none limiting embodiments, the description being with reference to the accompanying illustrative drawings. In the drawings:

FIG. 5 is a front view of an embodiment of a TO package according to the present invention connected to a PCB;

FIG. 6 is a side view of the TO package of FIG. 5;

DETAILED DESCRIPTION

Figure 1:
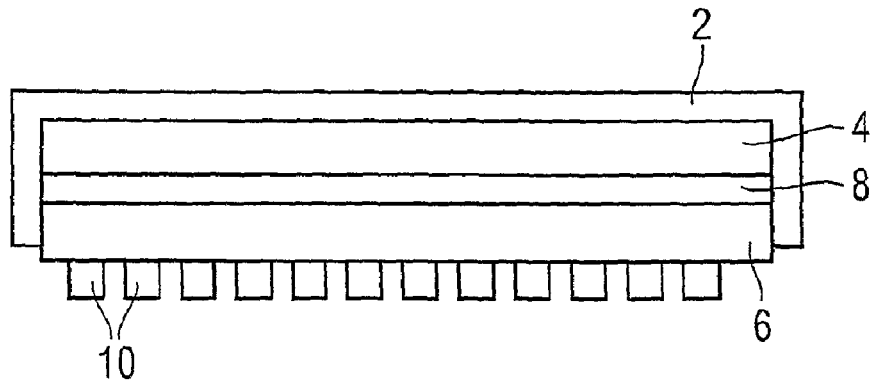
FIG. 1 is a schematic illustration of a structure of a typical control module for an automobile.

FIG. 1 shows schematically a control module for an automobile, also known as a smart junction box. The control module comprises a housing (2), within which is housed an electronic driver (4) comprising multi-layered PCBs on which are mounted various electronic components which together perform the functionality of the control module. The electronic driver (4) is connected to the various electronic components of the automobile via a fuse and relay PCB (6) on which are mounted various electronic components which together perform the functionality of the fuse and relay PCB. A metallic heat spreading bus bar (8) is located within the housing between the multi-layered PCBs of the electronic driver (4) and the fuse and relay PCB (6) and acts as a heat sink and ground plane for the components mounted on at least the fuse and relay PCB (6). The fuse and relay PCB (6) is connected to the electronic components of the automobile via a plurality of module connectors or spade output terminals (10).

The fuse and relay PCB (6) has a plurality of semiconductor IC high power MOSFET devices mounted on it. The high power MOSFET devices generate a lot of heat and so are generally provided in the form of a transistor outline (TO) integrated package.

Conventionally separate components are required for making a connection between the TO package and the module connectors (10) and for making a connection between the TO package and the bus bar (8). The TO packages described herein are integrated with a source tab lead (106, 109, 206) for making a direct connection to or which transition into a module connector (10) and are integrated with a bus bar connector (16, 116). The TO packages described herein also offer the possibility of a combination of through hole and surface mount connection to a PCB, which provides a very stable mounting, while meeting the USCAR pitch requirements for the mounting of the TO packages on the fuse and relay PCB (6).

Figure 2:
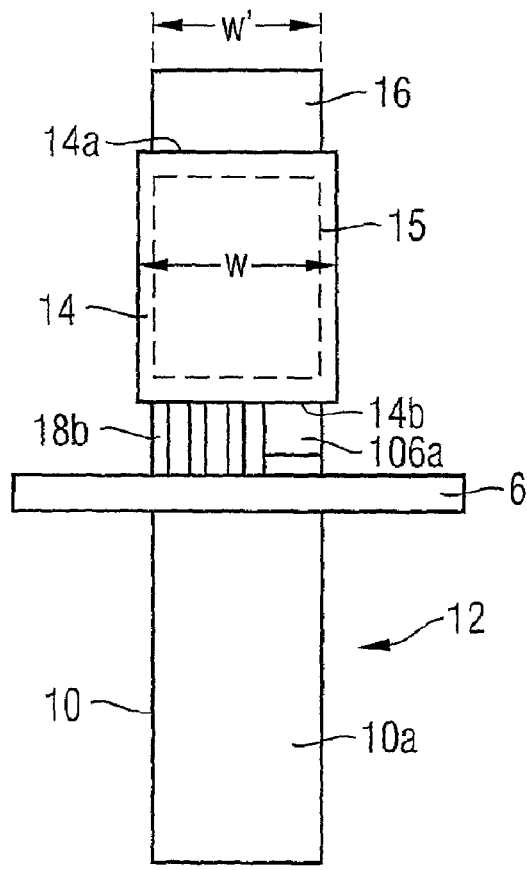
FIG. 2 is a front view of an embodiment of a TO package according to the present invention connected to a PCB.
Figure 3:
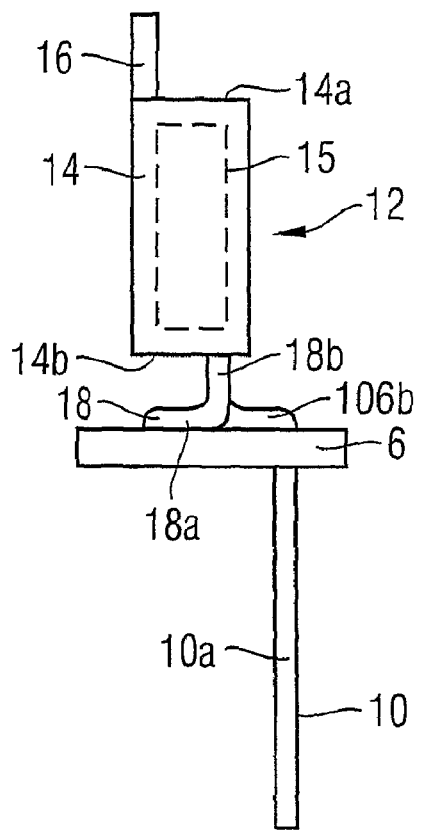
FIG. 3 is a side view of the TO package of FIG. 2.
Figure 4:
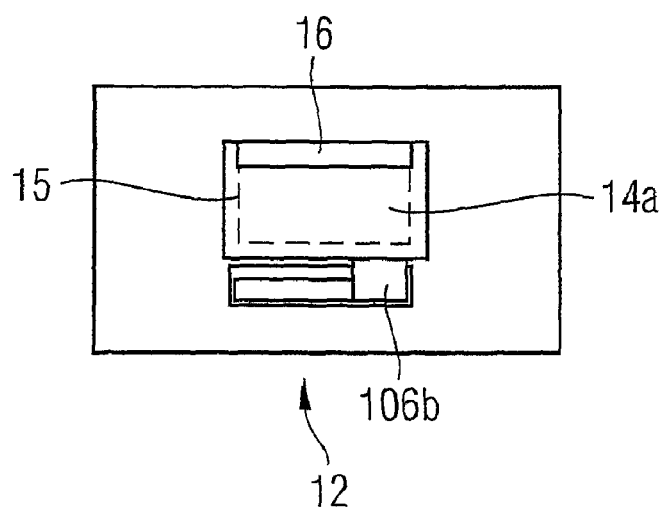
FIG. 4 is a plan view of the TO package of FIG. 2

One embodiment of a TO package (12), is shown in FIGS. 2 to 4. The TO package (12) is suitable for use in a control module of an automobile, for example, of the type described above in relation to FIG. 1. The TO package (12) is suitable for connection between a printed circuit board (PCB), for example a fuse and relay PCB (6), and a bus bar (8) of such a module. The TO package (12) comprises a leadframe and a semiconductor integrated device (15) encapsulated together in a package housing (14) to form the package (12). The package housing (14) will generally be plastic molded over the device and leadframe.

In the embodiments of the invention described herein, the width (w) of the package housing (14) is marked on the Figures and is the largest dimension of the package housing extending substantially parallel to the PCB (6) on which the package is mounted. The width measurements referred to herein extend substantially parallel to the width (w) marked in the Figures. If a pair of parallel planes are constructed, one at either end of the width measurement (w), so that the width dimension is normal to both of the planes, the phrase 'extending within the width' is defined as extending within the space bounded by these two planes. A first direction is also defined herein, as the general direction in which the first portions of the connection leads (18b) and the neck portion or portions of the source tab lead or leads (106, 109, 206) extend side by side. In the embodiments described herein, the first direction is substantially parallel to the width dimension, and for the purpose of illustration is marked on FIG. 9, as direction (D). In the embodiments described herein the width (w) of the package housing is substantially the same from the upper end (14a) to the lower end (14b) of the package housing.

The TO package (12) has a leadframe, generally formed from a planar blank which is suitably stamped and folded. The leadframe is encapsulated with a semiconductor integrated device (15), as is well known in the art. Connector leads (18) extend from a first lower end (14b) of the package housing, each having first portions (18b) adjacent to the first end of the package housing. In addition, a source tab lead (106) extends from the first end (14b) of the package housing. A heat sink and ground plane blade (16) extends from a second end (14a) of the package housing. In the embodiment of FIGS. 2 to 4, the first and second ends of the package housing are opposite ends of the package housing. The source tab lead (106) is formed with a neck portion (106a) which has a width less than the width (w) of the first end (14b) of the package housing. This provides space for the first portions (18b) of the connection leads (18) and for the neck portion (106a) of the source tab lead (106) to depend side by side from the first end (14b) of the package housing within the width of the package housing, as is shown particularly in FIG. 2.

The TO package is mounted on the upper side of the fuse and relay PCB (6) with the source tab lead (106) connecting through a slot in the PCB (6) to a module connector (10) which extends below the PCB (6) and out of the control module housing (2). Thus the TO package (12) is provided with a source tab lead (106) suitable for through hole connection to a module connector (10) through the PCB (6).

The package housing (14) has a uniform width (w) and the leadframe, or at least a blank from which the leadframe is formed has a uniform width (w').

The leadframe of the TO package (12) forms a plurality of leads (18, 106), which extend from the package housing (14), each lead having a first portion (18b, 106a) adjacent to and depending from the lower end of the package housing so that these first portions (18b, 106a) fit within the width (w) of the first end of the package housing. One of the leads (106) is the source tab lead suitable for connection to a module connector (10) and the other leads (18) are connector leads suitable for connection to the PCB (6).

A heat sink blade (16) is formed from the leadframe of the package (12) and acts to dissipate heat from the high power MOSFET device (15) encapsulated in the package (12) as well as providing a ground plane connection. The heat sink blade (16) extends upwardly from the upper second end (14a) of the package housing (14). When the TO package (12) is mounted on the fuse and relay PCB (6), the end of the heat sink blade (16) remote from the package housing (14) contacts the bus bar (8) of the control module. In this way heat is dissipated from the package (12), along the heat sink blade (16) to the bus bar (8).

The source tab lead (106) is also formed from the package leadframe and provides an electrical connection to the MOSFET device (15) of the package (12) and extends from the lower first end (14b) (opposite to the upper end (14a)) of the package housing (14). The module connector (10) which has a width similar to the width of the package housing (14) extends laterally offset to and below the package and is connected to the end of the source tab lead (106) remote from the package housing (14). In order to provide space for the plurality of leads (18), the source tab lead (106) is formed with a reduced width, as compared to the width (w) of the package housing (14) and the width of the module connector (10). The source tab lead (106) has a neck portion (106a) which extends downwardly from the lower end (14b) of the package housing. The source tab lead (106) then bends through 90 degrees to form a second part (106b) which extends along the upper surface of the fuse and relay PCB (6) laterally of the first direction. It then bends through a further 90 degrees to form a third part, which extends substantially parallel, but laterally offset, to the first part and extends through a slot in the fuse and relay PCB (6). The third part of the source tab lead (106) is a through hole connected to the source tab (10), which forms the module connector.

Thus, the package (12) has a source tab lead (106) which is suitable for connection at its end remote from the package housing (14) to a module connector (10). The module connector (10) extends below and yet within the width (w) of the package housing. Thus, the first portions (18b) of the connection leads (18) depend from the first end (14b) of the package housing into a space to the side of the neck portion (106a) of the source tab lead (106) below the first end (14b) of the package housing and above the module connector (10). In this way the first portions (18b) of the connection leads (18) and the neck portion (106a) of the source tab lead (106) extend side by side in a line within the width (w) of the package housing (14). This side-by-side arrangement enables the integrated TO package to meet the pin to pin pitch and pin row to pin row pitch requirements of USCAR (mentioned above).

In the embodiment of the present invention shown in FIGS. 2 to 4, the plurality of connection leads (18) are suitable for drain, gate and other logic connections between the MOSFET device (15) of the package (12) and the fuse and relay PCB (6) by SMD mounting. The connection leads (18) are formed from the package leadframe and are designed to make suitable electrical connections to the device (15) encapsulated within the package (12), as is well known in the art. These leads (18) have a first portion (18b) extending downwardly of the lower first end (14b) of the package housing (14). Each first portion transitions via a 90 degree bend into a second portion (18a) which extends laterally to the first direction along the upper surface of the PCB (6) so facilitating SMD mounting of the TO package onto the fuse and relay PCB (6). As can be seen in FIG. 3, the second portions (18a) of the connection leads bend to one side so as to extend laterally of the first direction.

Another embodiment of the TO package according to the present invention is shown in FIGS. 5 and 6, with like parts shown by like numerals. The main difference between the embodiment of FIGS. 2 to 4 and that of FIGS. 5 and 6 is the configuration of the leads. In the embodiment of FIGS. 5 and 6 there are two source tab leads (109) one to each side of a plurality of connector leads (18).

In the embodiment of FIGS. 5 and 6, a pair of source tab leads (109) are formed from the package leadframe and extend from the lower first end (14b) (opposite to the upper second end (14a)) of the package housing (14). A common module connector (10) which again has a width similar to the width of the package (12) is connected to the ends of the source tab leads (109) remote from the package housing (14). The source tab leads (109) and module connector (10) can be connected by dual source wire bonding so as to form a through hole mounting for the package (12) on the PCB (6). In order to provide space for the plurality of leads (18), a space is provided between the pair of source tab leads (109). In this embodiment source tab leads (109) and the module connector extend in the same plane, downwardly from the lower first end (14b) of the package housing (14).

The spaced source tab leads (109) enable the leadframe of the package (12) to be formed with a plurality of connection leads (18) that extend from the lower end (14b) of the package housing, without any of the leads extending beyond the width (w) of the package (12). That is, the source tab leads (109) which are formed as neck portions and the first portions (18b) of the plurality of leads (18) extend side-by-side from the lower end (14b) of the package, along the width (w) of the package, but not beyond. This side-by-side arrangement enables the integrated TO package (12) shown in FIGS. 4 and 5 to meet the pin to pin pitch and pin row to pin row pitch requirements of USCAR (mentioned above). The source tab leads (109) and the first portions (18b) of the connector leads (18) extend side by side, preferably along a line in the first direction.

Again, the plurality of connection leads (18) are suitable for drain, gate and other logic connections between the MOSFET device (15) encapsulated within the package (12) and the fuse and relay PCB (6) by SMD mounting. The connection leads (18) are formed from the package leadframe and are designed to make suitable electrical connections to the encapsulated device (15), as is well known in the art. These leads (18) have a first portion (18b) extending downwardly of the lower end (14b) of the package housing. The first portions (18b) of the connection leads and the neck portions (109) of the source tab leads extend side by side in the first direction. In FIG. 5, the first direction is in the plane of the paper substantially parallel to the width dimension and in FIG. 6 it extends normally to the plane of the page. Each first portion (18b) transitions into a second portion (18a) which extends laterally of the first direction, along the upper surface of the PCB (6) so facilitating SMD mounting of the TO package onto the fuse and relay PCB (6).

Thus, the source tab leads (109) are formed as neck portions having a width, and a combined width less than the width (w) of the package housing and less than the width of the module connector (10). This provides space for the first portions (18b) of the connector leads (18) and the source tab leads (109) to depend side by side from the lower end (14b) of the package housing within the width (w) of the package housing (14).

Figure 7:
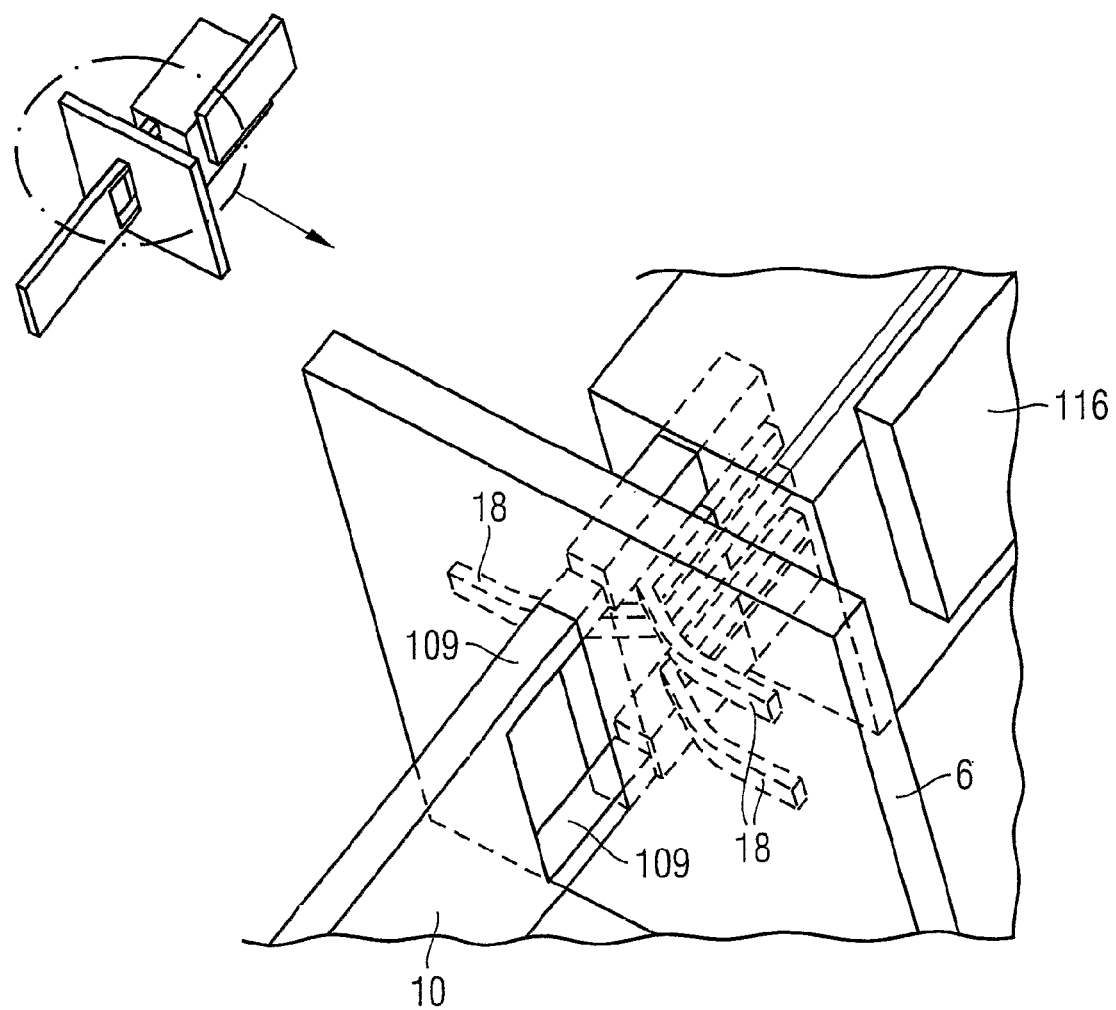
FIG. 7 is a perspective view of the TO package of FIG. 5.

As is shown in FIG. 7, the leads (18) can be bent so as to extend in opposing directions, laterally of the first direction so as to enable high stability SMD type mounting on the PCB (6). In FIG. 7 a first set of the connection leads (the lead (18) extending to the left in FIG. 7) bend to one side so as to extend laterally in a first direction along the surface of the PCB (6) and a second set of the connection leads (the two leads (18) extending to the right in FIG. 7) bend in a direction opposite to said first side along the surface of the PCB (6).

A further embodiment of the present invention is shown in FIGS. 8 to 11, with like parts shown with like numerals to the first embodiment. The main differences between the first and third embodiments are the mounting of the head sink blade (116) on the bus bar (8) and the configuration of the source tab lead (206) and module connector (10)

Figure 8:
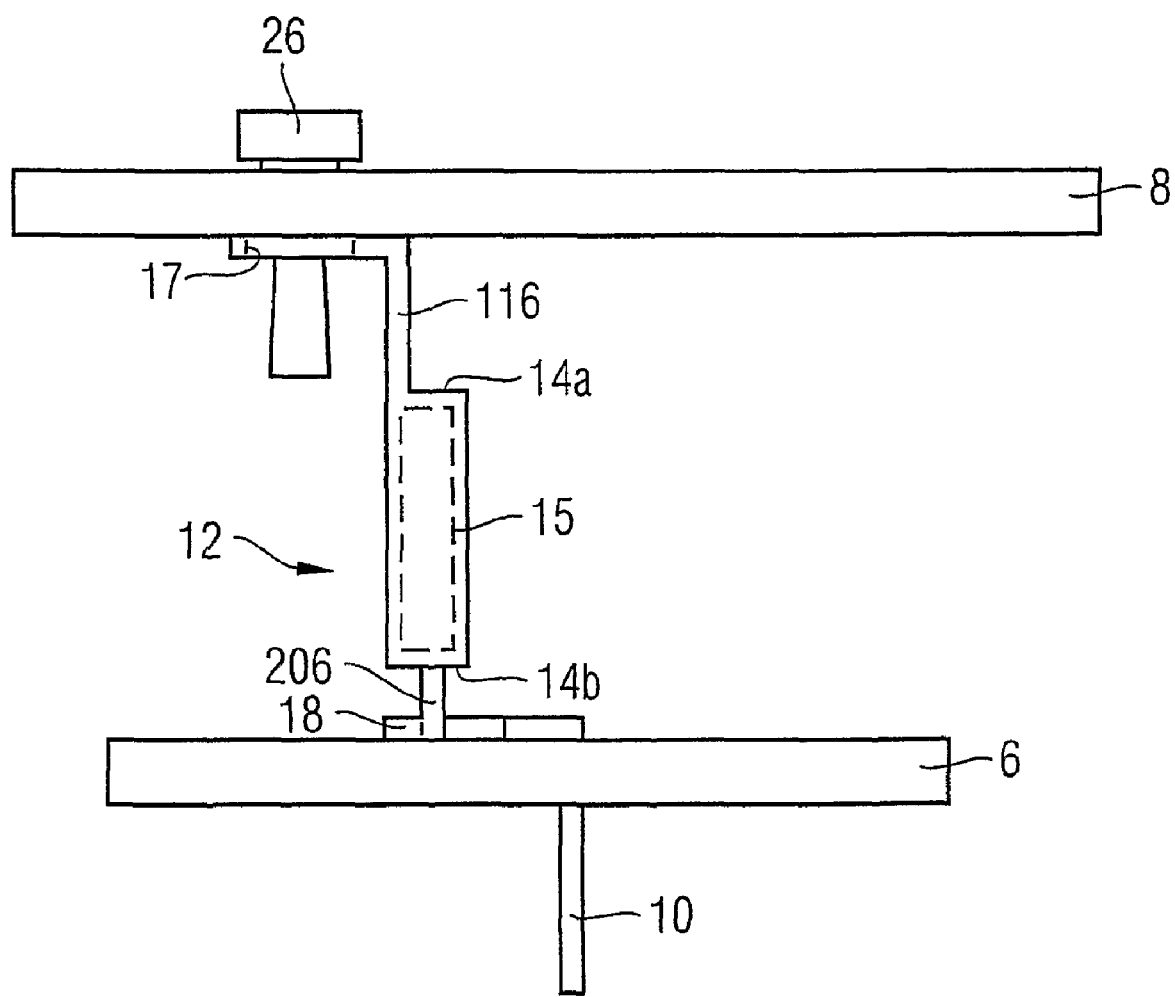
FIG. 8 is a perspective view of a TO package according to the present invention connected between a PCB and a bus bar heat spreader.

As shown in FIG. 8, this embodiment of the TO package (12) is mounted on the upper side of the fuse and relay PCB (6) with the source tab (10) extending below a slot in the PCB (6) so that the source tab (10) extends below the PCB (6) and out of the control module housing (2), so as to form a module connector. The heat sink blade (116) which is formed from the package leadframe, has a first portion which extends upwardly from the upper second end (14a) of the package housing. The first portion transitions into a second portion of the heat sink blade through a 90 degree bend, so that the second portion of the heat sink blade (116) extends parallel to and along the lower surface of the bus bar (8). The second portion of the heat sink blade is formed with a through hole (17) which enables connection to the bus bar (8) via a screw (26). The screw (26) passes through a hole in the bus bar (8) and through the hole (17) so as to form a rigid connection between the heat sink blade (116) and the bus bar (8). This provides improved heat dissipation from within the package housing (14), along the heat sink blade (116) to the bus bar (8).

Again the source tab lead (206) is also formed from the package leadframe and provides an electrical connection to the MOSFET device (15) encapsulated within the package (12) and extends from the lower first end (14b) of the package housing. The module connector (10) which has a width similar to the width of the package housing (14) is connected to or is formed integrally with the end of the source tab lead (206) remote from the package housing. In order to provide space for the plurality of connection leads (18), the source tab lead (206) is formed with a neck portion (206a) of reduced width, as compared to the width of the package housing (14) and the width of the module connector (10). The width dimensions are measured in a direction substantially parallel to a first direction (D) identified in FIG. 9. The source tab lead (206) has a first neck portion (206a) which extends downwardly from the lower end (14b) of the package housing (14). The source tab lead (206) then bends through 90 degrees to form a second part (206b) which extends along the upper surface of the fuse and relay PCB (6), laterally to the first direction (D). The second part (206b) then transitions into a first part of the module connector (10), which has a similar width as the package housing (14) and which continues to extend along the upper surface of the PCB (6). The first part of the module connector (10) then bends through 90 degrees to form a second part, which extends substantially parallel, but laterally offset, to the first part of the source tab lead (206) and extends through a slot in the fuse and relay PCB (6) and below the PCB (6).

The reduced width neck portion (206a) of the source tab lead (206) enables the leadframe of the package (12) to be formed with a plurality of connection leads (18) that extend from the lower first end (14b) of the package housing, without the leads extending beyond the width (w) of the package housing (14). That is, the source tab lead neck portion (206a) and first portions (18b) the plurality of leads (18) extend side-by-side from the lower end (14b) of the package housing, along the width of the package housing, but not beyond, as is shown particularly in FIG. 9. This side-by-side arrangement enables the integrated TO package according this embodiment to meet the pin to pin pitch and pin row to pin row pitch requirements of USCAR (mentioned above).

Figure 9:
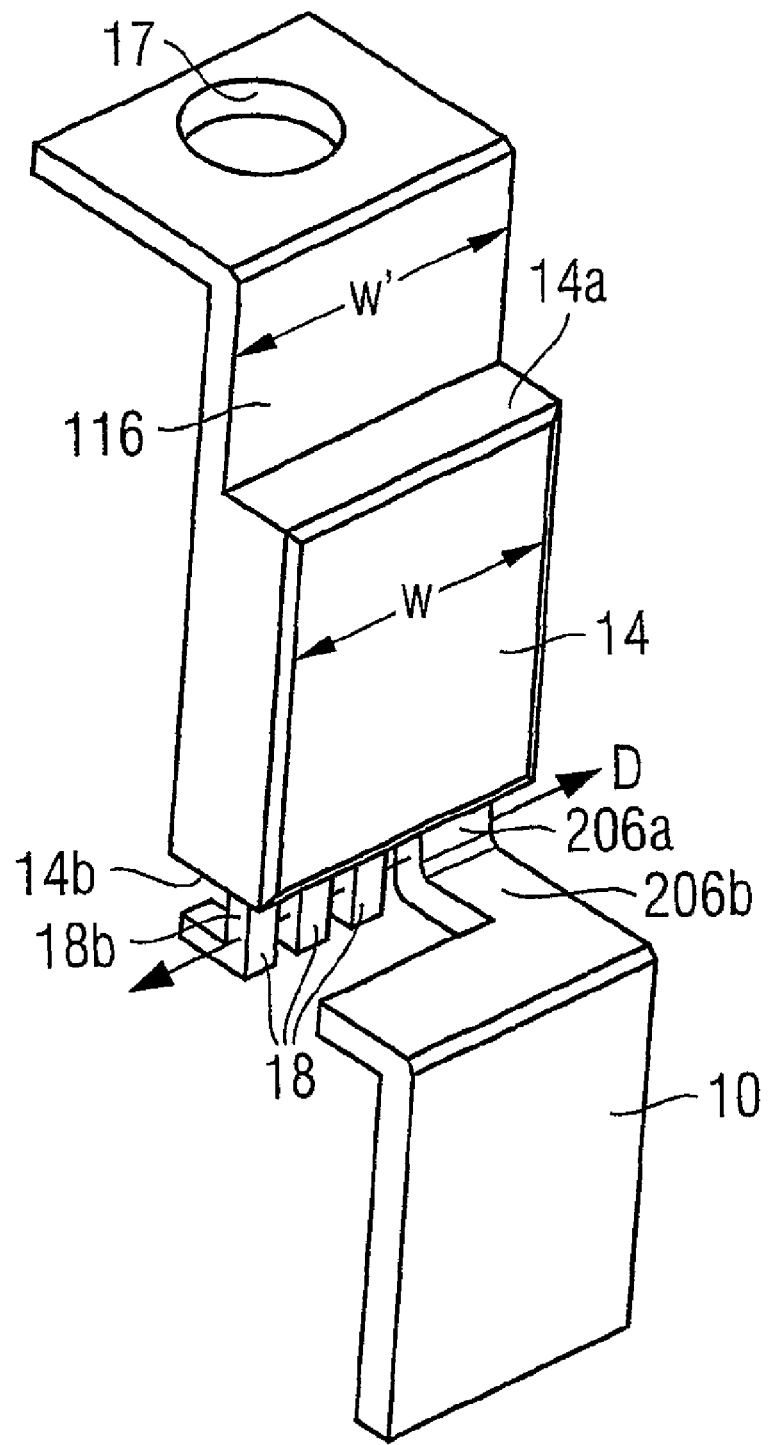
FIG. 9 is a perspective view of the TO package of FIG. 8.
Figure 10:
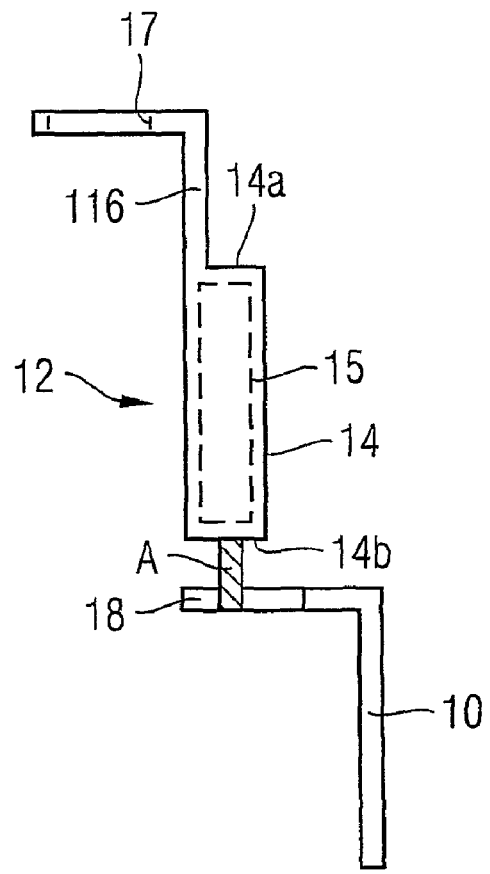
FIG. 10 is a side view of the TO package of FIG. 8.
Figure 11:
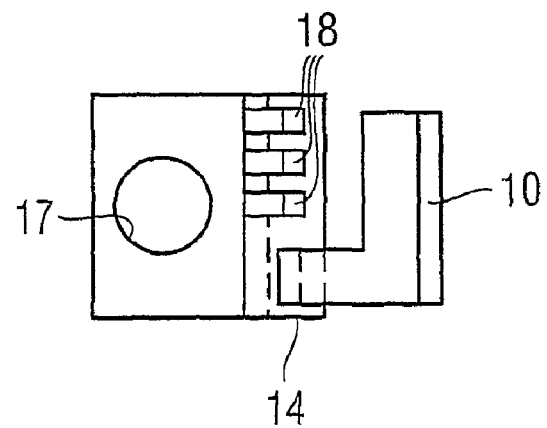
FIG. 11 is a view of the underside of the TO package of FIG. 8.

The neck portion (206a) of the source tab lead (206) and the first portions (18b) of the connection leads (18) extend side by side, preferably along a line. In FIG. 9, the leads extend side by side in a first direction aligned with the arrow marked (D), and substantially parallel to the width measurement (w). In FIG. 10 the first direction extends perpendicularly of the plane of the paper, extending from the shaded area (A) where lead portions (206a, 18b) overlap.

The plurality of connection leads (18) are suitable for drain, gate and other logic connections between the MOSFET device (15) encapsulated within the package (12) and the fuse and relay PCB (6) by SMD mounting. The leads (18) are part of the package leadframe and are designed to make suitable electrical connections to the encapsulated device (15), as is well known in the art. These leads (18) have a first portion (18b) extending downwardly of the lower end (14b) of the package housing. Each first portion transitions via a 90 degree bend into a second portion which extends along the upper surface of the PCB (6), laterally to the first direction (D) so facilitating SMD mounting of the TO package onto the fuse and relay PCB (6). In this third embodiment, the leads (18) bend in the opposite direction to the source tab lead (206). Both the connection leads (18) and the source tab lead (206) bend so as to extend laterally of the first direction (D).

In the embodiment of FIGS. 8 to 11, the source tab (206) is formed with a neck portion (206a) adjacent to the first end (14b) of the package housing (14). This neck portion (206a) has a width less than the width (w) of the package housing (14) and less than the width of the module connector (10). This provides space for the first portions (18b) of the connector leads (18) and the neck portion (206a) of the source tab lead (206) to depend side by side from the first end of the package housing, within the width of the package housing (14).

A control module of an automobile, of the type described in relation to FIG. 1, has a housing (2) containing at least one PCB and at least one metallic bus bar (8) and comprises a plurality of module connectors (10) for connecting the control module to electronic components of such an automobile. The control module may additionally comprise at least one TO package according to any of the embodiments of FIGS. 2 to 11, in which, for each TO package, the heat sink blade (16, 116) is connected to the or one of the bus bars (8) so as to dissipate heat from the package (12), the connector leads (18) are connected to the or one of the PCBs and the source tab lead (106, 109, 206) is connected to or transitions into one of the module connectors (10).

In the embodiments described in relation to FIGS. 1 to 11, the or each source tab (106, 109, 206) includes a relatively narrow portion, the neck or first portions (106a, 109a, 206a), near to the package housing (14) for connection to a wider module connector (10) further away from the package housing (14). The relatively narrow portion can be connected to a module connector (10) via through hole connection, e.g. via a slot in the printed circuit board (6). Alternatively, as shown in the embodiment of FIGS. 8 to 11, the source tab (206) can transition into the module connector (10), which module connector then passes through the PCB (6). The relatively narrow portion (106a, 109a, 206a) enables some overlap in the width dimension between the first portions (18b) of the connector leads (18) and the relatively narrow portions (106a, 109a, 206a) of the source tab lead. For example in FIG. 3, the narrow portion (106a) is behind the first portions of the connection leads (18) and so these overlap in the width direction, i.e., in a direction normal to the plane of the paper in FIG. 3. In FIG. 6, the first portions of the connection leads (18) and one of the source tab leads are behind the other of the source tab lead (109a), and so again these overlap in the width direction, normal to the plane of the paper in FIG. 6.

The invention claimed is:

1. A semiconductor outline package, comprising:
   a semiconductor integrated device encapsulated in a package housing having a first end with a width;
   a connection lead and a source tab lead which extend away from the first end of the package housing along a vertical direction, the connection lead having a first portion adjacent to the first end of the package housing; and
   a heat sink and ground plane blade which extends from a second end of the package housing,
   wherein the source tab lead has a neck portion adjacent to the first end of the package housing, the neck portion having a width less than the width of the first end providing space for the first portion of the connection lead, the neck portion overlaps within the width of the first end of the package housing, and wherein the neck portion transitions into a module connector, the module connector having a width greater than the width of the neck portion, wherein the connection lead is suitable for surface mount connection to a printed circuit board (PCB), and wherein the source tab lead is suitable for through hole connection to the module connector through the PCB.

2. The package according to claim 1 wherein a second portion has a width substantially greater than the width of the neck portion.

3. The package according to claim 1 wherein there are two source tab leads located one to each side of a plurality of connection leads.

4. The package according to claim 1 wherein the first portion and the neck portion extend side by side in a first direction and the connection lead bends to one side so as to extend laterally to the first direction and another connection lead bends in the opposite direction.

5. The package according to claim 1 wherein the first portion and the neck portion extend side by side in a first direction and the source tab lead bends to one side so as to extend laterally to the first direction.

6. The package according to claim 1 wherein the first portion and the neck portion extend side by side in a first direction and the connection lead bends to one side so as to extend laterally to the first direction and the source tab lead bends in the opposite direction.

7. The package according to claim 5 wherein the bent portion of the source tab lead transitions into the module connector.

8. The package according to claim 1 wherein the heat sink blade is shaped so as to include a portion which is suitable to extend along a surface of a bus bar.

9. The package according to claim 1 wherein the package housing has a substantially uniform width from the first end to the second end.

10. The package according to claim 1 which is suitable for use in a control module of an automobile for connection between a printed circuit board and a bus bar of a module.

11. A semiconductor outline package comprising:
    a semiconductor integrated device encapsulated in a package housing having a first end with a width;
    a plurality of leads, each lead having a first portion adjacent to and extending out of the package housing, wherein the first portions fit within the width of the package housing; and
    a heat sink and ground plane blade which extends from a second end of the package housing,
    wherein at least one of the plurality of leads is a source tab lead which transitions into a module connector of a control module and at least one of the plurality of leads is a connection lead suitable for connection to a printed circuit board (PCB), wherein the connection leads are configured to be attached as a surface mount connection to a PCB, wherein the source tab lead pass through the PCB as a through hole connection to the module connector, and
    wherein the module connector has a width substantially greater than a width of any of the first portions.

12. The package according to claim 11 wherein the first portions all extend side by side in a line.

13. The package according to claim 11 wherein the first portions extend side by side in a first direction and wherein there is one source tab lead and a width of the source tab lead in the first direction is less than the width of the package housing so as to provide space to at least one side of the source tab lead for the connector leads.

14. The package according to claim 11 wherein the semiconductor integrated device is a high power MOSFET.

15. The package according to claim 11 wherein the first portions extend side by side in a first direction and at least one connection lead bends to one side so as to extend laterally to the first direction along the surface of a PCB and at least one connection lead bends in the opposite direction.

16. The package according to claim 11 wherein the first portions extend side by side in a first direction and the source tab leads bend to one side so as to extend laterally to the first direction along the surface of a PCB.

17. The package according to claim 11 wherein the first portions extend side by side in a first direction and the connection leads bend to one side so as to extend laterally to the first direction along the surface of a PCB and the source tab leads bend in the opposite direction.

18. The package according to claim 16 wherein the portion of the source tab lead suitable to extend along a surface of a PCB transitions into the module connector.

19. The package according to claim 11 wherein the heat sink and ground plane blade is shaped so as to have a portion which extends along a surface of a bus bar.

20. The package according to claim 19 wherein the portion of the heat sink and ground plane blade extending along a bus bar surface includes fixing means for facilitating rigid mechanical connection to a bus bar.

21. A control module of an automobile comprising at least one PCB, at least one metallic bus bar, a plurality of module connectors for connecting the control module to electronic components of an automobile, at least one package according to claim 11,
wherein the heat sink blade is connected to the bus bar so as to dissipate heat from the package, the connection leads are connected to the PCBs and the source tab leads are connected to one of the module connectors.

22. The package according to claim 1, the second end of the package housing being opposite to the first end of the package housing along the vertical direction.

23. The package according to claim 22, wherein the first portion of the connection lead and the neck portion of the source tab lead are parallel along the vertical direction, and wherein the connection lead comprises an other portion along a horizontal direction.

24. The package according to claim 23, wherein the other portion of the connection lead is suitable for surface mount connection to a PCB.

25. The package according to claim 23, wherein the source tab lead comprises an other portion along the horizontal direction, the other portion of the source tab lead extending in a opposite direction to the other portion of the connection lead.

* * * * *